United States Patent [19]
Carcia et al.

[11] Patent Number: 5,897,976
[45] Date of Patent: Apr. 27, 1999

[54] ATTENUATING EMBEDDED PHASE SHIFT PHOTOMASK BLANKS

[75] Inventors: Peter Francis Carcia; Roger Harquail French, both of Wilmington, Del.

[73] Assignee: E. I. du Pont de Nemours and Company, Wilmington, Del.

[21] Appl. No.: 08/797,442

[22] Filed: Feb. 10, 1997

Related U.S. Application Data

[60] Provisional application No. 60/019,039, May 20, 1996.

[51] Int. Cl.$^6$ ........................................................ G06F 9/00
[52] U.S. Cl. ...................................................................... 430/5
[58] Field of Search ........................ 430/5, 322; 428/432

[56] References Cited

U.S. PATENT DOCUMENTS

| | | | |
|---|---|---|---|
| 5,415,953 | 5/1995 | Alpay et al. | 430/5 |
| 5,459,002 | 10/1995 | Alpay et al. | 430/5 |
| 5,679,483 | 10/1997 | Maurer | 430/5 |

FOREIGN PATENT DOCUMENTS

| | | |
|---|---|---|
| 0 620 497 A2 | 10/1994 | European Pat. Off. . |
| 0 643 331 A2 | 3/1995 | European Pat. Off. . |
| 6-282066 | 10/1994 | Japan . |
| 7-5676 | 1/1995 | Japan . |
| 7-175203 | 7/1995 | Japan . |
| 7-181664 | 7/1995 | Japan . |
| 7-199447 | 8/1995 | Japan . |
| 7-209849 | 8/1995 | Japan . |
| 7-255467 | 8/1995 | Japan . |
| 94/17449 | 8/1994 | WIPO . |

OTHER PUBLICATIONS

Shul, R.J. et al., High rate electron cyclotron resonance etching of GaN, InN, and AlN, *Journal of Vacuum Science Technology*, B13(5), 2016–2021, Sep./Oct. 1995.

Carcia, P.F., Evolution of Metal Multilayers For MO Recording, *Proceedings of Magneto–Optional Recording International Symposium '94, Magn. Soc. Jpn.*, vol. 19, 5–16, Sep. 1994.

Levenson, M.D., Wavefront Engineering For Photolithography, *Physics Today*, 28–36, Jul. 1993.

Stix, G., Toward "Point One", *Scientific American*, 90–95, Feb. 1995.

McLane, G.F. et al., Magnetron reactive ion etching of AlN and InN in $BCl_3$ plasmas, *Journal of Vacuum Science & Technology*, A13(3), 724–726, Jan. 1995.

Shih, K.K. et al., Thin film materials for the preparation of attenuating phase shift masks, *Journal of Vacuum Science & Technology*, B12(1), 32–36, Jan./Feb. 1994.

Mileham, J.R. et al., Wet chemical etching of AlN, *Appl. Phys. Lett.*, 67(8), 1119–1121, Aug. 1995.

Kalk, F.D. et al., Attenuated phase–shifting photomasks fabricated from Cr–based embedded shifter blanks, *Photomasks and X–Ray Mask Technology*, SPIE vol. 2254, 64–70, Apr. 1994.

M. Takekazu et al. (Dainippon Printing Co Ltd), Halftone Phase Shift Photomask and Blank For Halftone Phase Shift Photomask, *Patent Abstracts of Japan*, Publication No. 08272074, Oct. 18, 1996.

B. W. Smith et al., Development and characterization of nitride and oxide based composite materials for sub 1.18 $\mu m$ attenuated phase shift masking, *Microelectronic Engineering*, 35, No. 1–4, 201–204, Feb. 1997.

*Primary Examiner*—S. Rosasco

[57] ABSTRACT

Attenuating embedded phase shift photomask blanks capable of producing a phase shift of 180° and having an optical transmissivity of at least 0.001 at selected lithographic wavelengths <400 nm comprise at least one layer of an aluminum compound and at least one component that is more optically absorbing than the aluminum compound at selected lithographic wavelengths <400 nm and are made by depositing at least one layer of an aluminum compound and at least one component that is more optically absorbing than the aluminum compound onto a substrate.

17 Claims, 7 Drawing Sheets

ATTENUATING EMBEDDED PHASE SHIFT PHOTOMASK BLANKS

This application claims the benefit of U.S. Provisional Application 60/019,039, filed on May 20,1996.

BACKGROUND OF THE INVENTION

This invention relates to phase shift photomask blanks in photolithography with short wavelength (i.e., <400 nm) light. More specifically this invention relates to phase shift photomask blanks that attenuate and change the phase of transmitted light by 180° relative to light propagating the same path length in air. Such photomask blanks are commonly known in the art as attenuating (embedded) phase shift photomask blanks or half-tone phase shift photomask blanks.

The electronics industry seeks to extend optical lithography for manufacture of high density integrated circuits to critical dimensions of 0.25 mm and smaller. To achieve this, lithographic photomask blanks will need to work with short wavelength light, i.e. <400 nm. Two wavelengths targeted for future optical lithography are 248 nm (KrF laser wavelength) and 193 nm (ArF laser wavelength). A phase shift photomask enhances the patterned contrast of small circuit features by destructive optical interference.

The concept of a phase shift photomask and photomask blank that attenuates light and changes its phase was revealed by H. I. Smith in U.S. Pat. No. 4,890,309 ("Lithography Mask with a p-Phase Shifting Attenuator"). Known attenuating embedded phase shift photomask blanks fall mainly into two categories: (1) Cr-based photomask blanks containing Cr, Cr-oxide, Cr-carbide, Cr-nitride, Cr-fluoride or combinations thereof; and (2) $SiO_2$- or $Si_3N_4$-based photomask blanks, containing $SiO_2$ or $Si_3N_4$ together with a predominantly opaque material, such as MoN or $MoSi_2$. Commonly the latter materials are referred to generically as 'MoOSiN'.

Cr-based photomask blanks have the advantage that they are chemically durable and can use most of the familiar processing steps developed for opaque Cr photomask blanks. The second category of photomask blanks based on $SiO_2$- or $Si_3N_4$ exploit their transparency into the deep UV and ease of dry etching with more innocuous fluorine-base chemistry. However, the need to develop photomask blanks for even shorter wavelengths (<200 nm) renders Cr chemistries less desirable because photomask blanks based exclusively on Cr (i.e., oxides, nitrides, carbides, fluorides or combinations thereof) are too optically absorbing at such wavelengths. The disadvantage of 'MoSiON' photomask blanks in this short wavelength regime is that they are too Si-rich and consequently have poor etch selectivity relative to the quartz ($SiO_2$) substrate. Thus, they require an etch stop, an additional layer of a material which etches poorly in a fluorine etchant.

In addition, there are references in the literature to attenuating embedded phase shift photomask blanks comprising hydrogenated amorphous carbon layers, tantalum and its compounds with a layer of Cr metal, or one or more layers composed of a hafnium compound.

SUMMARY OF THE INVENTION

The invention comprises an attenuating embedded phase shift photomask blank capable of producing a 180° phase shift and having an optical transmissivity of at least 0.001 at selected lithographic wavelengths <400 nm, the photomask blank comprising at least one layer of an aluminum compound and at least one component that is more optically absorbing than the aluminum compound at selected lithographic wavelengths <400 nm. Aluminum nitride, aluminum oxynitride and aluminum oxide are examples of preferred aluminum compounds. These compounds are relatively transparent at short wavelength, robust, etchable and with etch selectivity relative to a quartz substrate. The more optically absorbing component is preferable selected from the group consisting of elemental metals, metal oxides, metal nitrides and mixtures thereof. Most preferably, the more optically absorbing component is selected from oxides of Ti, Fe, In, Co, Bi, Mn, Cu, Sn, Cr, Ni, V, Nb, Ta, Mo, metals in the lanthanide series and W; or nitrides of Ti, Nb, Mo, Cr, W, Ta, Zr, Hf, or V, and elemental metals.

In another aspect, the invention comprises a process for preparing attenuating embedded phase shift photomask blank capable of producing a 180° phase shift and having an optical transmissivity of at least 0.001 at selected lithographic wavelengths <400 nm, the process comprising depositing at least one layer of an aluminum compound and at least one component that is more optically absorbing than the aluminum compound at selected lithographic wavelengths <400 nm on a substrate.

These and other features of the invention will become apparent upon a further reading of the specification, with reference to the drawing figures, and the appended claims.

DETAILED DESCRIPTION OF THE EMBODIMENTS

As is known in the art, a "photomask blank" differs from a "photomask" in that the latter term is used to describe a photomask blank after it has been imaged. While every attempt has been made to follow that convention herein, those skilled in that art will appreciate the distinction is not a material aspect of this invention. Accordingly, it is to be understood that the term "photomask blanks" is used herein in the broadest sense to include both imaged and non-imaged photomask blanks.

The phase shift photomask blanks of this invention can assume three different forms: (1) a cermet, (2) a multilayer, or (3) a composite material. The preferred method for preparing the photomask blanks is by physical vapor-deposition (e.g., sputtering or evaporation), but other methods known to those skilled in the art for depositing materials on a substrate can also be used.

Cermets

The term "cermets" is used to refer to photomask blanks comprising an elemental metal homogeneously or inhomogeneously dispersed in a ceramic matrix. In the context of this invention, cermets are denoted as M/AlX, where M refers to a small concentration of metal and AlX refers to a ceramic matrix of an aluminum compound.

Cermets, such as Al/AlN or Ru/Al$_2$O$_3$, were prepared either by sputtering or electron beam evaporation. In the case of sputtering, the stainless steel chamber was evacuated to a background pressure of at least $1\times10^{-4}$ Pa with a cryopump prior to sputtering experiments. Either a turbomolecular or diffusion pump would also be suitable. We used metal targets between 5 cm and 20 cm in diameter. DC magnetron, RF magnetron, and RF diode sputtering modes were all effective for making cermets. For sputtering cermets, the target can be a single metal as for Al/AlN, or multicomponent target, such as for Cr-SiO films. Sputtering conditions determine the chemical composition in the case of an elemental metal target, while the ratio of the target constituents determine chemical composition in a multicomponent material.

Prior to depositing films on substrates, the metal target was presputtered or preconditioned by sputtering it in pure Ar for at least 30 minutes to produce a clean, reactive surface. Then films were sputtered in Ar and a partial pressure of N$_2$ to form a nitride, or O$_2$ to form an oxide, or O$_2$ plus N$_2$ to form an oxynitride. Typical total sputtering pressures were $1.3\times10^{-2}$ Pa or less, to promote growth of dense films. But higher pressures could also be used, if it were beneficial to modify other film properties, such as stress. In general, the vacuum conditions, target preconditioning, and sputtering conditions were similar for cermets, multilayers, and composites.

In the case of preparing the cermets by electron beam evaporation, the vacuum system was evacuated with a turbomolecular pump to a background pressure of less than $1\times10^{-4}$ Pa prior to vapor deposition of films. Separate evaporation sources were used for vapor-deposition of the Al compound and the metal. The deposition rates of material from each of these electron-beam heated sources were independently monitored and controlled by quartz crystal rate controllers. The chemical composition of cermets made by this vapor deposition method could be controlled by the relative deposition rates. In general, the vacuum and deposition practices were similar for vapor-deposited cermets, multilayers, and composites.

Multilayers

The term "multilayers" is used to refer to photomask blanks comprised of alternating layers of the Al compound with layers of the more optically absorbing component. To facilitate the manufacture of these multilayers, it is preferred that the Al compound and the more optically absorbing component be of the same type, e.g., they are both nitrides or both oxides. The layers can be ultra-thin (1–2 monolayers) or much thicker. The relative layer thicknesses control optical properties. The layering can be periodic or aperiodic; layers can all have the same thickness, or they can each be different. Graded layer thicknesses can also be advantageously used to engineer different film reflectivities at the same transmission. Multilayering is attractive because optical properties can be engineered by the choice of individual layer thickness, while maintaining the same process conditions.

Multilayer photomask blanks were made by sputtering from separate metal targets in partial pressures of Ar and other reactive gases such as N$_2$ or O$_2$. The targets were physically apart so that their sputtered fluxes did not overlap. Both targets were operated in the same sputtering gas environment, although the power applied to each target, and consequently its sputtering rate, was usually different. Multilayer growth proceeded by pausing substrates on a rotatable table under each target consecutively. The chemical composition of films was adjusted by the thickness of individual layers, controlled by their deposition rates and the length of time substrates were paused under each target. Alternatively, the substrates could be rotated continuously at a constant rate and individual layer thicknesses fixed only by sputtering rates. When substrates were paused under targets, the times that they were stationary could be programmed so as to produce either periodic or aperiodic multilayer structures.

Composites

The term "composites" is used to refer to photomask blanks comprising an atomic or molecular mixture of the Al compound and the more optically absorbing component, chosen from the oxides of Ti, Fe, In, Co, Bi, Mn, Cu, Sn, Cr, Ni, V, Nb, Ta, Mo, metals in the lanthanide series and W, or the nitrides of Ti, Nb, Mo, Cr, W, Ta, Zr, Hf, or V. This mixture can be homogeneous or inhomogeneous. As with multilayers, to facilitate the manufacture of these composite materials, it is preferred that the Al compound and the more optically absorbing component be of the same type. Composites differ from cermets in that the more optically absorbing component is a metal oxide or nitride, whereas in cermets it is an elemental metal.

Composite photomask blanks were prepared by co-sputtering from at least two targets. The targets had a confocal geometry, so that they coated the substrate with the Al compound and the more optically absorbing component (s) simultaneously, achieving a atomic mixture. The chemical composition of these composites was controlled by the relative deposition rates of individual targets. Alternatively, composites could also be formed by first growing compositionally equivalent multilayers and then heating them, causing chemical homogenization by interdiffusion of the layers, or by depositing films from a multicomponent target with the desired chemistry.

Optical Properties

The optical properties (index of refraction, "n" and extinction coefficient, "k") were determined from variable angle spectroscopic ellipsometry at three incident angles from 186–800 nm, corresponding to an energy range of 1.5–6.65 eV, in combination with optical reflection and transmission data. Optical constants were fit to these data simultaneously, using an optical model of the film that allowed for less dense (50%) interfacial layers at the substrate and the top surface of the film. From knowledge of the spectral dependence of optical properties, the film thickness corresponding to 180° phase shift, optical transmissivity, and reflectivity can be calculated. See generally, O. S. Heavens, Optical Properties of Thin Solid Films, pp 55–62, Dover, N.Y., 1991, incorporated herein by reference.

EXAMPLES

Examples 1–8: Al/AlN Cermets

Preparation

Table 1 summarizes synthesis conditions for Al/AlN cermets, where P is the total pressure of Ar+$N_2$, %N is the percentage of $N_2$ in the Ar+$N_2$ gas mixture, Pw is the power and Vs is the voltage applied to the Al target, R is the deposition rate for the film, and d is its thickness. The target was 7.6 cm diameter Al, RF magnetron sputtered in a cryo-pumped sputtering system with a typical background pressure of about $2.6 \times 10^{-5}$ Pa. Prior to sputtering films, the Al target was presputtered in 1.3 Pa Ar at 500 W for about one hour. This insured that before introducing $N_2$, the target surface was highly reactive, metallic Al. AlN formed when films were reactivivly sputtered from an Al target in a partial pressure of about 20% $N_2$/80% Ar, whereas metallic Al films formed when sputtering was in Ar alone. Sputtering at intermediate partial pressure produced films comprised of AlN and Al phases.

Figure 1:
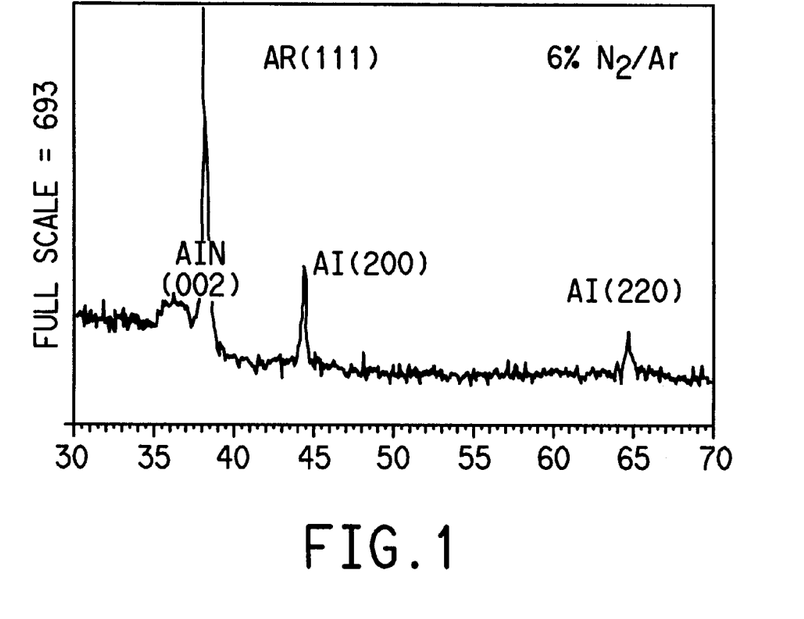
FIG. 1 is an X-ray diffraction pattern of an Al/AlN cermet photomask blank of this invention prepared in a 6% $N_2$/Ar gas mixture.
Figure 2:
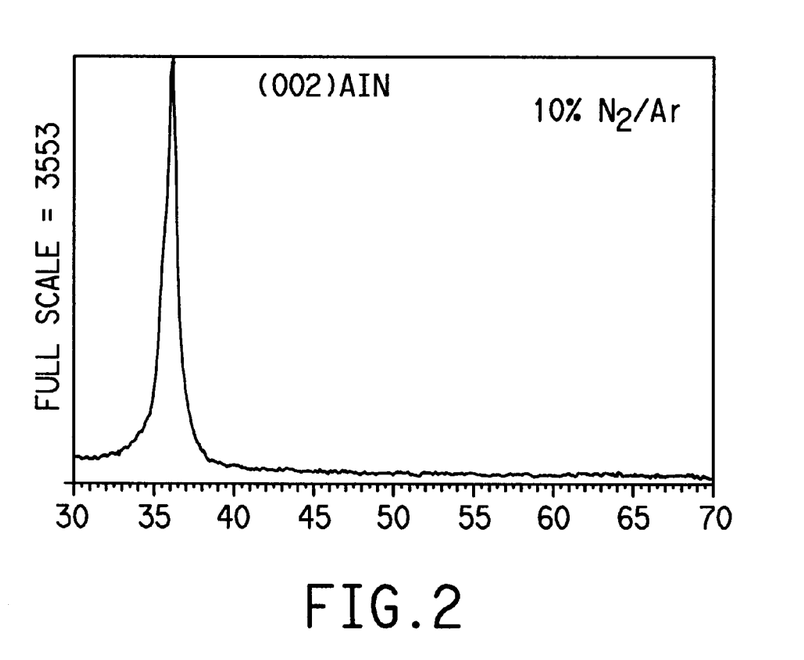
FIG. 2 is an X-ray diffraction pattern of an Al/AlN cermet photomask blank of this invention containing 10% $N_2$/Ar gas mixture.
Figure 3:
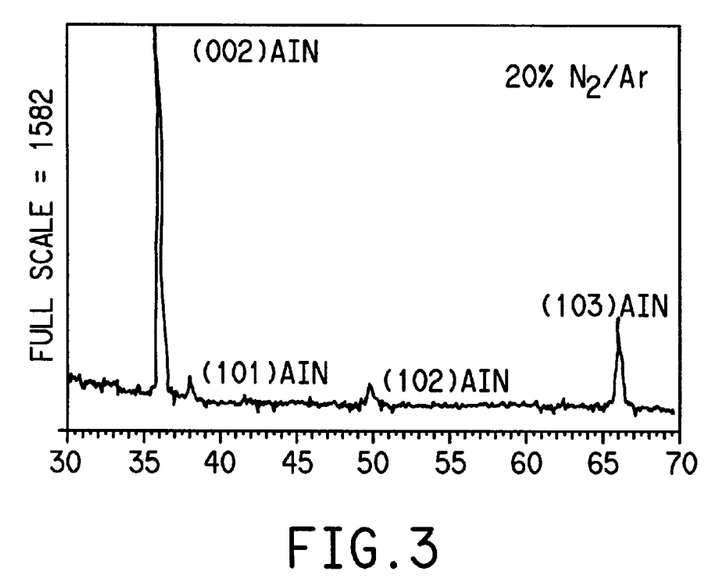
FIG. 3 is an X-ray diffraction pattern of an Al/AlN cermet photomask blank of this invention containing 20% $N_2$/Ar gas mixture.

By X-ray diffraction, films sputtered in at least 20% $N_2$ were single phase AlN with the wurtzite structure and c-axis texture. For $N_2$ partial pressure less than 10%, both Al and AlN peaks explicitly appeared in diffraction patterns. At 6% $N_2$, diffraction was dominated by Al peaks, with only trace amounts of AlN detectable. Although at 10% $N_2$, X-ray diffraction, which has a sensitivity of ~5% for crystalline phases, only detected AlN, the increase of the film optical absorption is implicit evidence for the presence of Al. These X-ray diffraction patterns are shown in FIGS. 1–3.

Between 14% and 20% $N_2$, the deposition rate of the cermet was nearly constant at ~3 Å/s, indicating that the Al target was saturated with nitrogen, consistent with growth of single phase AlN films as indicated by X-ray diffraction. Below 14% $N_2$, the deposition rate increased rapidly, which signaled the onset of metallic mode sputtering; that is, the sputtering rate exceeded the N arrival rate at the target and substrate surface, and thus the concentration or flux of N was insufficient to form single phase AlN films. Under these conditions a cermet of Al plus AlN formed; the formation of an Al/AlN cermet for partial pressures of $N_2$ less than 14% was also consistent with a concomitant increase in optical absorption.

TABLE 1

| Example | P Pa | % N | Pw watts | R Å/s | d Å | Vs volts |
|---|---|---|---|---|---|---|
| 1 | .696 | 20 | 500 | 3.0 | ~1000 | 320 |
| 2 | .695 | 18 | 500 | 3.1 | ~1000 | 360 |
| 3 | .695 | 16 | 500 | 3.1 | ~1000 | 375 |
| 4 | .692 | 14 | 500 | 3.2 | ~1000 | 475 |
| 5 | .688 | 13 | 500 | 3.96 | ~1000 | 455 |
| 6 | .691 | 12 | 500 | 4.41 | ~1000 | 480 |
| 7 | .684 | 11 | 500 | 5.81 | ~1000 | 490 |
| 8 | .681 | 10 | 500 | 6.16 | ~1000 | 490 |

Optical and Phase Shift Properties

Figure 4:
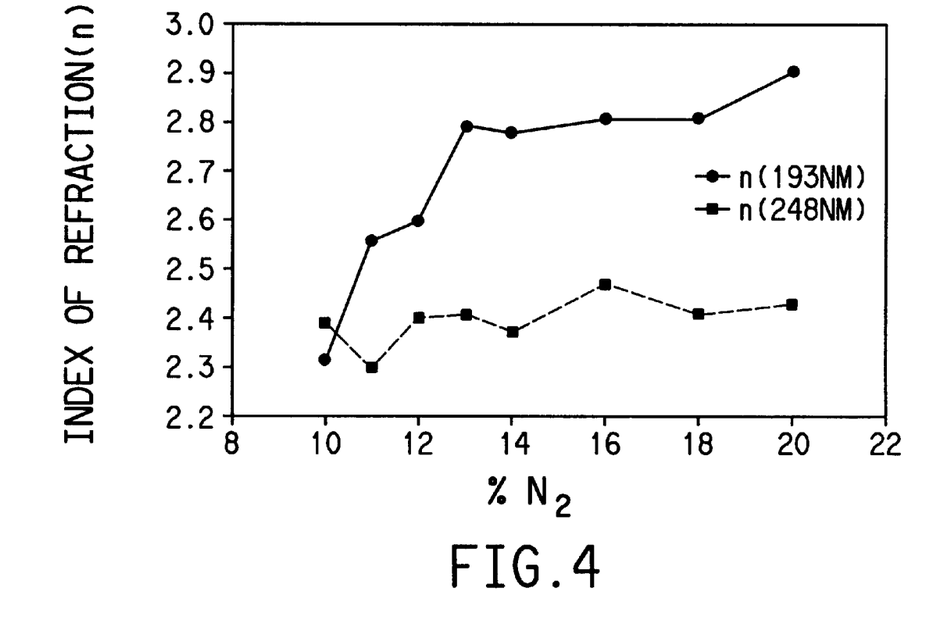
FIG. 4 is a graph showing the relationship between the index of refraction (n) and the partial pressure of $N_2$ during sputtering of the cermet photomask blanks.
Figure 5:
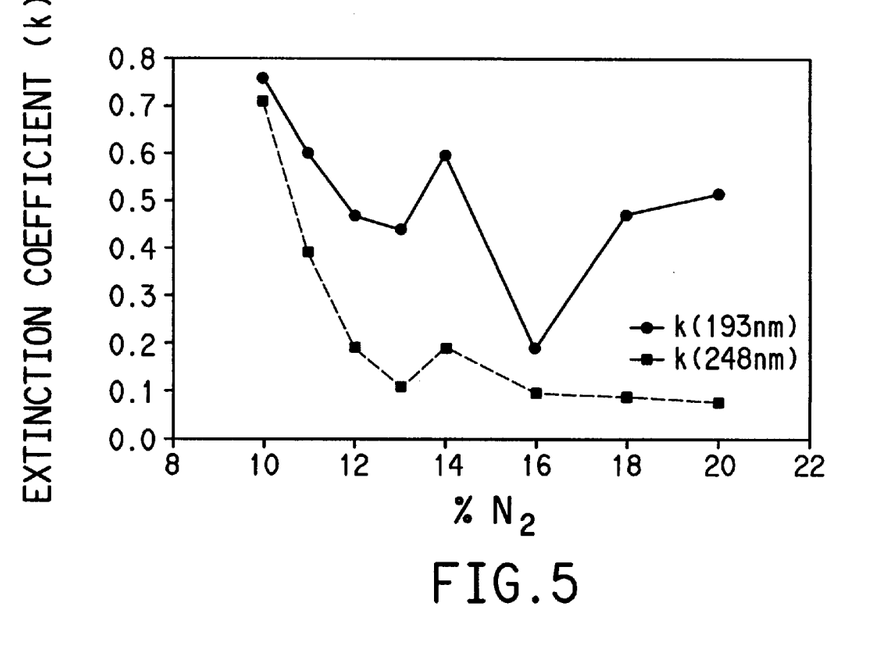
FIG. 5 is a a graph illustrating the relationship between the extinction coefficient (k) and the $N_2$ partial pressure during sputtering of the cermet photomask blanks.

FIGS. 4 and 5 summarize the dependence of the optical constants of Al/AlN cermets at 248 nm and 193 nm on the $N_2$-partial pressure during sputtering. The key feature of these data was the onset of a rapid change in optical constants near 13% $N_2$, precisely where the deposition rate increased, signaling the transition of the Al target from a nitrogen-saturated mode to nitrogen-deficient or more metallic state. The formation of Al/AlN cermets in films sputtered in the N-deficient target mode reduced n and increased k, consistent with the optical constants of Al (n=0.1 and k=2.2) at 193 nm. There was a similar trend at 248 nm, where n varied more slowly with $N_2$ sputtering gas pressure.

Figure 6:
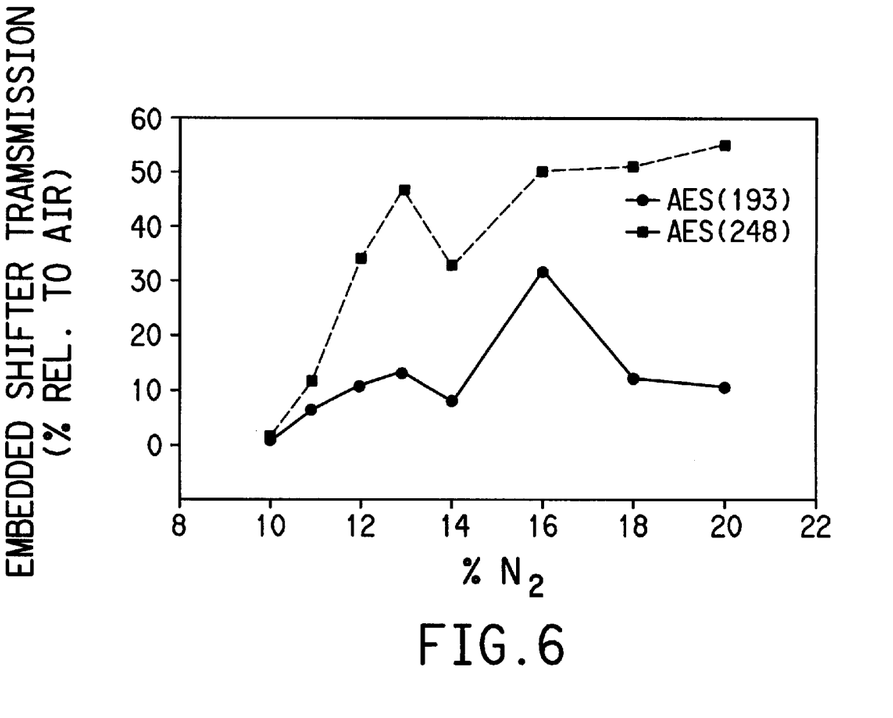
FIG. 6 is a graph showing the embedded shifter transmission (%T) as a function of $N_2$ partial pressure for the cermet photomask blanks.

FIG. 6 summarizes optical transmission at 193 nm and 248 nm calculated for film thicknesses corresponding to 180° phase shift in Al/AlN cermets as a function of the relative AlN concentration. Cermets with attractive characteristics for a phase shift photomask blank were achieved for $N_2$-partial pressures between 10 and 13%, for which we estimate Al metal concentrations of less than 10%. Specifically, for 11% $N_2$, 180° phase shift was achieved at 193 nm in a 640 Å thick film with ~6% transmission, and at 248 nm in a 970 Å thick film with 12.4% transmission.

Example 9: Ru/$Al_2O_3$ Cermets

Preparation

Ru/$Al_2O_3$ cermets were made by electron-beam evaporation, using separate sources for Ru and $Al_2O_3$. Prior to vapor-deposition the vacuum chamber was evacuated with a turbomolecular pump to a background pressure of about $7 \times 10^{-5}$ Pa. The source materials were 99.6%, 2.5 cm×2.5 cm×. 0.051 cm $Al_2O_3$ broken into smaller pieces that could be packed in a carbon-lined, water-cooled Cu hearth, which has a volume of about 8 $cm^3$. A Ru button of purity 99.95% and a volume of about 5 $cm^3$ was placed directly in the other water-cooled, Cu hearth. Quartz substrates, 2.286 mm thick and 2.5 cm×3.8 cm were attached with metal clips to a rotatable aluminum table, positioned above and equi-distant (about 64 cm away) from the Ru and $Al_2O_3$ sources.

Metal shutters shielded substrates from vapor-deposition until $Al_2O_3$ and Ru evaporation rates, monitored and controlled by quartz crystal rate controllers, stabilized. The electron beam currents to the Ru and $Al_2O_3$ sources were gradually increased to 57 mA and 75 mA respectively, with a beam voltage of about 11 kV, resulting in average deposition rates of 1.5 Å/s for Ru metal and about 8.8 Å/s for $Al_2O_3$, corresponding to about 15 volume % Ru in the Ru/$Al_2O_3$ cermet that grew. After these rates had stabilized, the shutter was opened, exposing the rotating (3–5 rpm) quartz substrates to vapor-deposition from $Al_2O_3$ and Ru simultaneously. The deposition was sustained until a film of total thickness about 1000 Å uniformly coated the substrates, after which the shutter was closed and electron beam currents to the sources shut off.

Optical and Phase Shift Properties

From variable angle spectroscopic ellipsometry and optical refection and transmission data, the optical properties (index of refraction and extinction coefficient) were determined at 193 nm and 248 nm. At 193 nm, the complex index of refraction (n-i k) was determined to be 1.88- i 0.46, and at 248 nm it was 1.93- i 0.31. At both these wavelengths we calculated an optical transmission at the film thickness corresponding to a 180° phase shift. At 248 nm 180° phase shift can be achieved in this 15%-Ru/$Al_2O_3$ cermet in a 1350 Å thick film, which has a transmission of 10.1%; and at 193 nm a 1116 Å thick film achieves a 180° phase shift with a transmission of 3%. Both designs are in an attractive range of optical transmission for an embedded phase shift photomask blanks.

Examples 10–17: AlN/CrN Multilayers

Preparation

We sputtered periodic multilayers of AlN/CrN by pausing substrates on a rotating table consecutively under Cr and Al targets, which were physically apart in the vacuum chamber, so that their sputtered fluxes did not overlap. Sputtering was carried out in a 25% $N_2$/75% Ar gas mixture with total pressure $1.3 \times 10^{-2}$ Pa. Individual AlN and CrN thicknesses in these multilayers were fixed by programming the time substrates were paused under each target, using measured, static deposition rates: 1.5Å/s for AlN and 2.3 Å for CrN.

AlN was RF diode sputtered from a 15 cm diameter Al target, and CrN was RF magnetron sputtered from a 7.6 cm diameter sputtering gun. 450 watts from a common RF power supply was split to these individual targets by their separate RF matching networks. We determined individual sputtering rates for AlN and CrN from thicker films. Prior to a sequence of multilayer experiments, both targets were simultaneously presputtered in $1.3 \times 10^{-2}$ Pa of pure Ar for about one hour in order to create fresh, reactive metallic surfaces of Al and Cr before introducing $N_2$. During sputtering, the AlN target was biased at 1600 volts, while the Cr target was biased at 310 volts. Table 2 summarizes the AlN and CrN layer thicknesses in one period, and also the total number of bilayers (N) in the film. The total film thickness, which was maintained close to 1000 Å, corresponds to the bilayer thickness (AlN+CrN) multiplied by the number of bilayers, N.

| Example | N  | d(AlN), Å | d(CrN), Å | % CrN |
|---------|----|-----------|-----------|-------|
| 10      | 20 | 40        | 10        | 80    |
| 11      | 20 | 35        | 15        | 70    |
| 12      | 20 | 30        | 20        | 60    |
| 13      | 20 | 25        | 25        | 50    |
| 14      | 20 | 50        | 10        | 83    |
| 15      | 15 | 70        | 10        | 88    |
| 16      | 10 | 100       | 10        | 91    |
| 17      | 8  | 150       | 10        | 94    |

Optical and Phase Shift Properties

Figure 7:
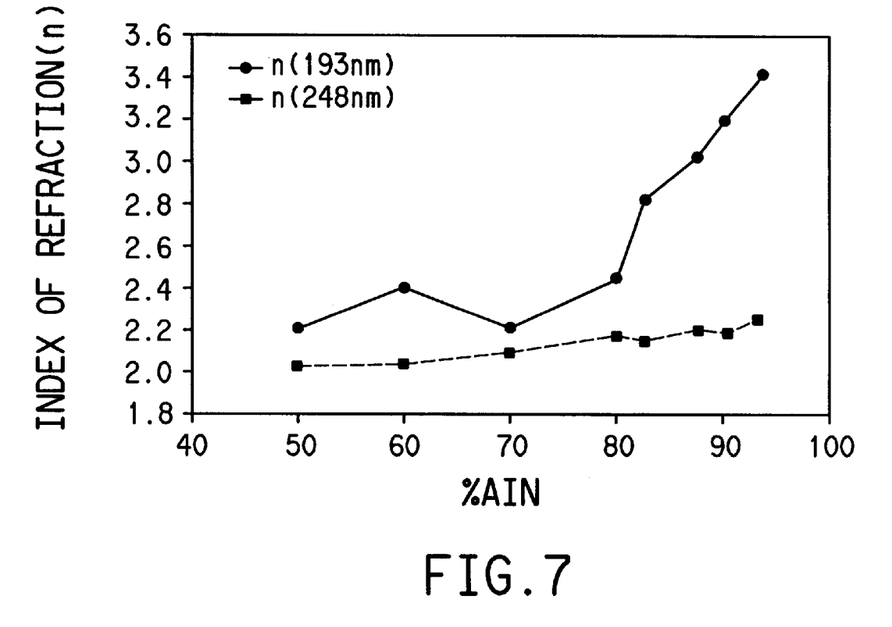
FIG. 7 is a graph illustrating the relationship between the index of refraction (n) and the % AlN in AlN/CrN multilayer photomask blanks.
Figure 8:
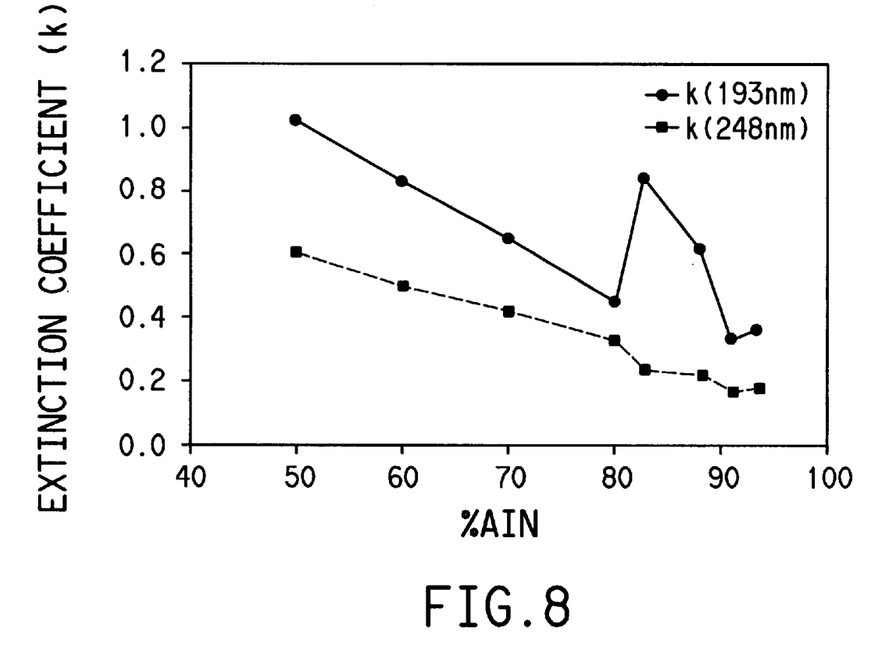
FIG. 8 is a graph illustrating the relationship between the extinction coefficient (k) and the % AlN in AlN/CrN multilayer photomask blanks.
Figure 9:
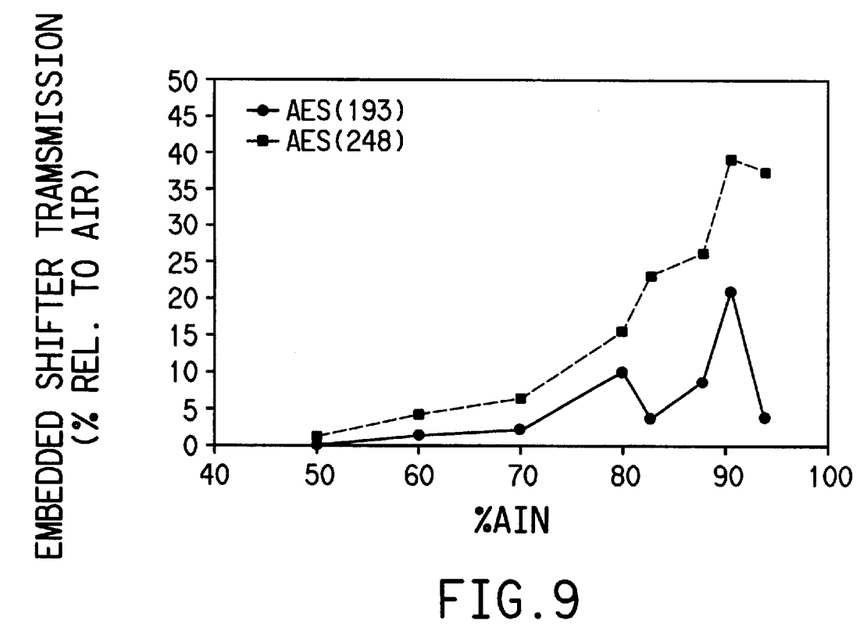
FIG. 9 is a graph showing the embedded shifter transmission (%T) as a function of the % AlN in AlN/CrN multilayer photomask blanks.

Optical constants (n, k) at 248 nm and 193 nm are given for CrN/AlN multilayers in FIGS. 7 and 8 as a function of the relative volume concentrations of CrN and AlN. At 248 nm the extinction coefficient systematically decreased from 0.6 at 50%-CrN/AlN to 0.16 at 6%-CrN/AlN. Over this same compositional range, n increased slowly from ~2.0 to 2.25 at 6%-CrN/AlN. These trends are consistent with the much smaller absorption and larger index of refraction of AlN. At 193 nm, the trends were similar down to 20%-CrN/AlN, but for smaller CrN concentrations FIG. 9 summarizes calculated optical transmission at 193 nm and 248 nm for 180° phase shift in AlN/CrN multilayers as a function of the relative AlN concentration. 180° phase shift was achieved in an acceptable range of optical transmission (5–10%) at both 248 nm and 193 nm. Up to an AlN concentration of 80%, there was a smooth, gradual dependence of optical transmission on composition for 180° phase shift designs, characteristic of an ideally tunable material system.

Examples 18–20: $Al_2O_3/CrO_x$ Multilayers

Preparation

Multilayers of $CrO_x/Al_2O_3$ were made by RF diode sputtering from a 15 cm diameter Al target and RF magnetron sputtering from a 7.6 cm diameter $CrO_x$ target in a 50% $O_2$/Ar gas mixture ($1.3 \times 10^{-2}$ total pressure). The thicknesses of the individual oxide layers was calculated from their respective static deposition rates, determined from thick films of each oxide. The rate for $Al_2O_3$ was 0.36 Å/s, and 0.54 Å/s for $CrO_x$. The RF power (500 watts) from a single supply was split to the individual targets by their matching networks. The target voltages were 1275 volts on the Al target and 285 volts on the Cr target. Table 3 summarizes the $Al_2O_3$ and $CrO_x$ layer thicknesses and the total number of layers (N) in the film.

TABLE 3

| Example | N  | d($Al_2O_3$), Å | d($CrO_x$), Å |
|---------|----|-----------------|---------------|
| 18      | 20 | 20              | 40            |
| 19      | 15 | 40              | 40            |
| 20      | 20 | 40              | 20            |

Optical and Phase Shift Properties

Figure 10:
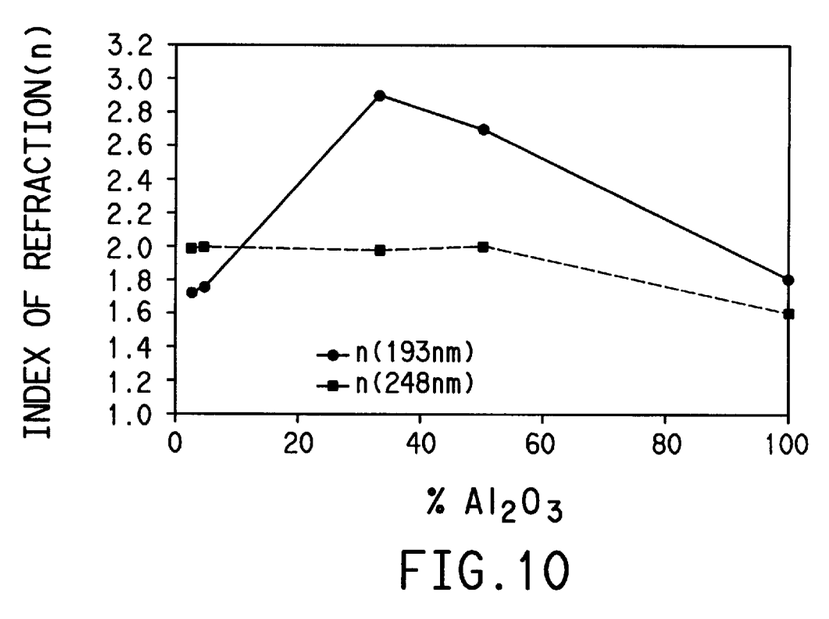
FIG. 10 is a is a graph illustrating the relationship between the index of refraction (n) and the % $Al_2O_3$ in $Al_2O_3/CrO_x$ composite photomask blanks.
Figure 11:
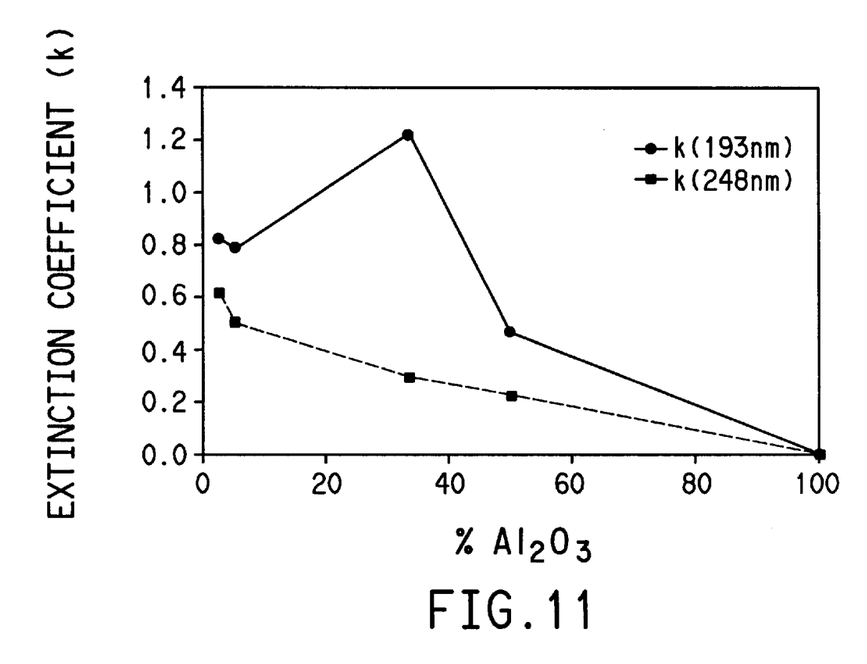
FIG. 11 is a graph illustrating the relationship between the extinction coefficient (k) and the % $Al_2O_3$ in $Al_2O_3/CrO_x$ composite photomask blanks.

The optical constants of $CrO_x/Al_2O_3$ multilayers, as a function of their relative volume concentration or thickness, are given in FIGS. 10 and 11. As for CrN/AlN multilayers, the dependence of n and k at 248 nm varied systematically with chemical composition. Increasing the $Al_2O_3$ concentration reduced the extinction coefficient, consistent with the measured transparency of $Al_2O_3$ films between 5 and 6.5 eV and its large bandgap, ~9 eV.

Figure 12:
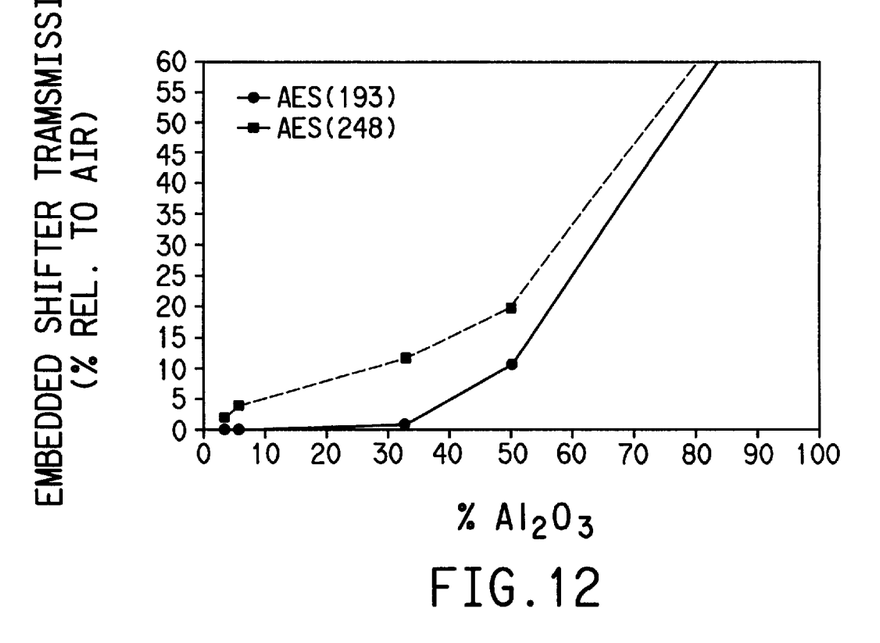
FIG. 12 is a graph showing the embedded shifter transmission (%T) as a function of the % $Al_2O_3$ in $Al_2O_3/CrO_x$ composite photomask blanks.

FIG. 12 summarizes calculated optical transmissions in $Al_2O_3/CrO_x$ multilayers with 180° phase shift at 193 nm and 248 nm as a function of the relative $Al_2O_3$ concentration or thickness. These data indicate that 180° phase shift with optical transmission of 5–15% can be achieved in $Al_2O_3/CrO_x$ 20 multilayers for $Al_2O_3$ concentrations less than 50%.

Example 21: AlN/$MoN_x$ Multilayers

Preparation

AlN/$MoN_x$ multilayers, 25×(40 Å AlN+10 Å $MoN_x$), were sputtered from Al (5 cm diameter) and Mo (7.6 cm diameter) targets, physically separated so that their sputtered fluxes did not overlap. Initially the targets were simultaneously presputtered in $1.3 \times 10^{-2}$ Pa of Ar: Mo was DC magnetron sputtered with 150 W(300 V) and Al was RF magnetron sputtered at 300 W (195 V) for 60 minutes. After presputtering, the AlN/$MoN_x$ multilayers were grown on quartz substrates in a 25% $N_2$/Ar gas mixture with a total pressure of $1.3 \times 10^{-2}$ Pa. The deposition rate was 0.86 Å/s for $MoN_x$ and 1.0 Å/s for AlN.

Optical and Phase Shift Properties

From variable angle spectroscopic ellipsometry and optical refection and transmission data, the optical properties (index of refraction and extinction coefficient) were determined at 193 nm and 248 nm. At 193 nm, the complex index of refraction (n-i k) was determined to be 2.365-i0.620, and at 248 nm it was 2.288-i0.37. At both these wavelengths we calculated an optical transmission at the film thickness corresponding to a 180° phase shift. At 248 nm 180° phase shift can be achieved in this AlN/MoN$_x$ multilayer in a 980 Å thick film, which has a transmission of 12.7%; and at 193 nm a 725 Å thick film achieves a 180° phase shift with a transmission of 4.1%. Both designs are in an attractive range of optical transmission for embedded phase shift photomask blanks.

Examples 22–24: AlN-CrN Composites

Preparation

AlN-CrN composites were prepared by sputtering reactively in a 20% N$_2$/Ar gas mixture from 5 cm diameter targets of Al and Cr. The Al was RF magnetron sputtered, while Cr was DC magnetron sputtered. The two sputtering guns were arranged in a confocal geometry, so that their sputtered fluxes overlapped at the quartz substrate, positioned about 15 cm from each target. After pumping the stainless steel chamber to a background pressure of $1.1\times10^{-4}$ Pa, the Cr and Al targets were presputtered in $1.3\times10^{-2}$ Pa Ar: the Cr target at 150 W and the Al target at 400 W. After presputtering, AlN-CrN composites with three different chemical compositions were deposited by simultaneous, reactive sputtering from Cr and Al targets on to a single quartz substrate, held statically. Details of the sputtering experiments are surnmarized in Table 4. Each film was about 1000 Å thick.

TABLE 4

| Example | Pw(Cr) (Watts) | R(CrN) (Å/s) | Pw(Al) (Watts) | R(AlN) (Å/s) | % CrN |
|---|---|---|---|---|---|
| 22 | 31 | 0.26 | 400 | 0.96 | 21 |
| 23 | 91 | 0.68 | 400 | 0.96 | 41 |
| 24 | 139 | 1.02 | 400 | 0.96 | 52 |

Optical and Phase Shift Properties

Figure 13:
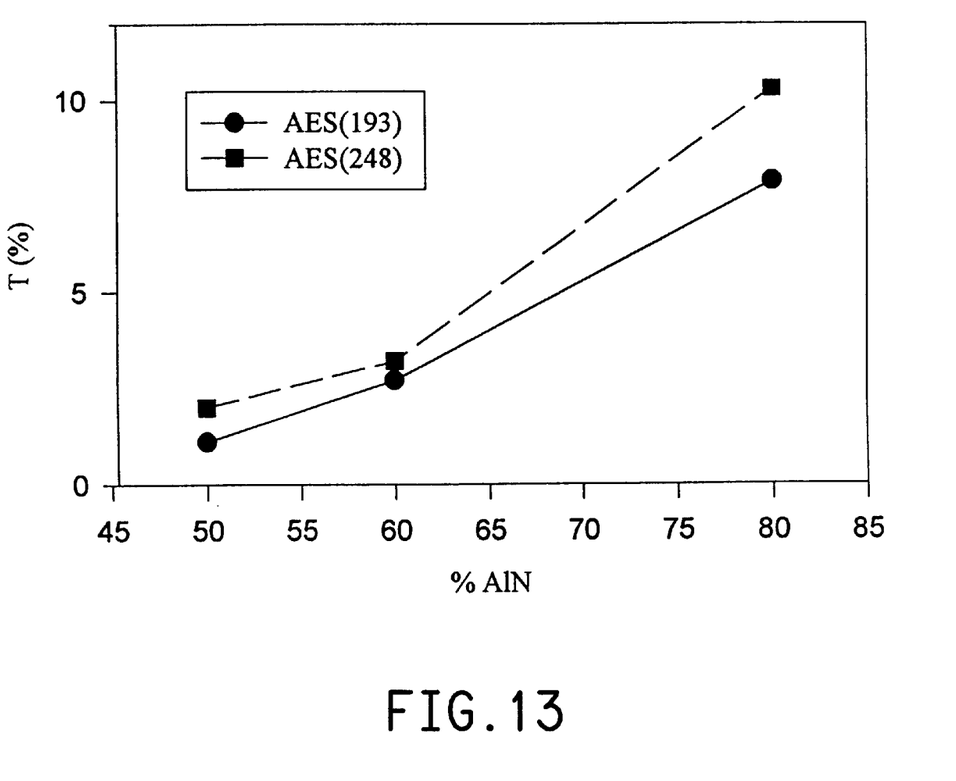
FIG. 13 is a graph showing the embedded shifter transmission (%T) as a function of % AlN in AlN/CrN composite photomask blanks.

From variable angle spectroscopic ellipsometry and optical reflection and transmission data, the optical properties (index of refraction and extinction coefficient) were determined at 193 nm and 248 nm. FIG. 13 summarizes calculated optical transmissions in AlN-CrN composites with 180° phase shift at 193 nm and 248 nm as a function of relative AlN concentration in the composite. These data indicate that 180° phase shifts with optical transmission of 5–15% can be achieved in AlN-CrN composites for AlN concentrations above about 50%.

What is claimed is:

1. An attenuating embedded phase shift photomask blank capable of producing a 180° phase shift and having an optical transmissivity of at least 0.001 at selected lithographic wavelengths <400 nm, the photomask blank comprising at least one layer of an aluminum compound and at least one component that is more optically absorbing than the aluminum compound at selected lithographic wavelengths <400 nm, wherein the aluminum compound is selected from the group consisting of aluminum nitride, aluminum oxynitride and aluminum oxide.

2. The photomask blank of claim 1, wherein the photomask blank is a cermet photomask blank.

3. The photomask blank of claim 1 wherein the photomask blank is a multilayer photomask blank.

4. The photomask blank of claim 3, comprising alternating layers of aluminum compound and more optically absorbing component.

5. The photomask blank of claim 1, wherein the photomask blank is a composite photomask blank.

6. The photomask blank of claim 1, wherein the more optically absorbing component is selected from the group consisting of elemental metals, metal oxides, metal nitrides and mixtures thereof.

7. The photomask blank of claim 1, wherein the more optically absorbing component is selected from the group consisting of (a) elemental metals, (b) oxides of Ti, Fe, In, Co, Bi, Mn, Cu, Sn, Cr, Ni, V, Nb, Ta, Mo, metals in the lanthanide series, or W; (c) nitrides of Ti, Nb, Mo, Cr, W, Ta, Zr, Hf, or V; and (d) mixtures thereof.

8. The photomask blank of claim 1, wherein the selected lithographic wavelength is selected from the group consisting of 193 nm, 248 nm, and 365 nm.

9. A process for preparing an attenuating embedded phase shift photomask blank capable of producing a 180° phase shift and having an optical transmissivity of at least 0.001 at selected lithographic wavelengths <400 nm, the process comprising depositing at least one layer of an aluminum compound and at least one component that is more optically absorbing than the aluminum compound at selected lithographic wavelengths <400 nm on a substrate, wherein the aluminum compound is selected from the group consisting of aluminum nitride, aluminum oxynitride and aluminum oxide.

10. The process of claim 9, wherein the deposition step comprises physical vapor deposition.

11. The process of claim 10, wherein the physical vapor deposition step is selected from the group consisting of sputtering and evaporation.

12. The process of claim 9, wherein the more optically absorbing component is selected from the group consisting of elemental metals, metal oxides, metal nitrides and mixtures thereof.

13. The process of claim 9, wherein the more optically absorbing component is selected from the group consisting of (a) elemental metals, (b) oxides of Ti, Fe, In, Co, Bi, Mn, Cu, Sn, Cr, Ni, V, Nb, Ta, Mo, metals in the lanthanide series, or W; (c) nitrides of Ti, Nb, Mo, Cr, W, Ta, Zr, Hf, or V; and (d) mixtures thereof.

14. The process of claim 9, wherein the more optically absorbing component is an elemental metal and wherein the deposited layer comprises the elemental metal dispersed within the aluminum compound to form a cermet photomask blank.

15. The process of claim 9, wherein alternating layers of the aluminum compound and the more optically absorbing component are deposited to form a multilayer photomask blank.

16. The process of claim 9 wherein the more optically absorbing component is not an elemental metal and wherein the layer deposited comprises a mixture of the aluminum compound and the more optically absorbing component to form a composite photomask blank.

17. The process of claim 9, wherein the selected lithographic wavelength is selected from the group consisting of 193 nm, 248 nm, and 365 nm.

* * * * *